United States Patent
Saitou

(10) Patent No.: US 9,441,293 B2
(45) Date of Patent: Sep. 13, 2016

(54) FILM-FORMING APPARATUS

(71) Applicant: Tokyo Electron Limited, Tokyo (JP)

(72) Inventor: Tetsuya Saitou, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 176 days.

(21) Appl. No.: 14/388,307

(22) PCT Filed: Mar. 18, 2013

(86) PCT No.: PCT/JP2013/001831
§ 371 (c)(1),
(2) Date: Sep. 26, 2014

(87) PCT Pub. No.: WO2013/145630
PCT Pub. Date: Oct. 3, 2013

(65) Prior Publication Data
US 2015/0047567 A1   Feb. 19, 2015

(30) Foreign Application Priority Data
Mar. 30, 2012   (JP) .................................. 2012-081729

(51) Int. Cl.
C23F 1/00        (2006.01)
H01L 21/306      (2006.01)
(Continued)

(52) U.S. Cl.
CPC ......... C23C 16/45508 (2013.01); C23C 16/34 (2013.01); C23C 16/4412 (2013.01);
(Continued)

(58) Field of Classification Search
CPC ................. C23C 16/45565; C23C 16/45587; C23C 16/45591; C23C 16/45508

USPC ........................................ 156/345.33, 345.34
See application file for complete search history.

(56) References Cited

U.S. PATENT DOCUMENTS 6,013,155 A * 1/2000 McMillin .............. C23C 16/455
                                                    118/723 I
6,165,311 A * 12/2000 Collins .................. B01D 53/22
                                                    118/723 AN
(Continued)

FOREIGN PATENT DOCUMENTS

JP      07-022323 A    1/1995
JP      2005-113268 A  4/2005
(Continued)

OTHER PUBLICATIONS

International Search Report issued on Apr. 23, 2013 for WO 2013/145630 A1.

Primary Examiner — Keath Chen
(74) Attorney, Agent, or Firm — Abelman, Frayne & Schwab

(57) ABSTRACT

A film-forming apparatus forms a film by sequentially supplying a plurality of kinds of reaction gases to a substrate placed between a placing unit and a ceiling plate in a processing chamber having vacuum atmosphere and supplying a replacement gas between supply of one reaction gas and supply of next reaction gas. A central gas ejecting unit is disposed above the central portion of the substrate, and includes gas ejecting ports formed therein to spread the gases toward the outer side in the horizontal direction. A peripheral gas supply unit is disposed to surround the central gas ejecting unit. The peripheral gas supply unit includes a plurality of gas ejecting ports, which is formed in the circumferential direction such that the gases are spread in the horizontal direction toward the outer circumferential side and the central side of the substrate in a plan view.

3 Claims, 11 Drawing Sheets

(51) Int. Cl.
   *C23C 16/455* (2006.01)
   *C23C 16/34* (2006.01)
   *C23C 16/44* (2006.01)
   *C23C 16/458* (2006.01)
(52) U.S. Cl.
   CPC ..... *C23C16/4583* (2013.01); *C23C 16/45506* (2013.01); *C23C 16/45565* (2013.01); *C23C 16/45574* (2013.01)

(56) References Cited

U.S. PATENT DOCUMENTS

| | | | | |
|---|---|---|---|---|
| 6,444,039 | B1* | 9/2002 | Nguyen | C23C 16/455 118/715 |
| 8,110,068 | B2* | 2/2012 | Qiu | H01J 37/3244 118/715 |
| 2005/0208217 | A1* | 9/2005 | Shinriki | C23C 16/34 427/248.1 |
| 2008/0230518 | A1* | 9/2008 | Brillhart | C23C 16/45502 216/58 |
| 2010/0310772 | A1* | 12/2010 | Tsuda | C23C 16/409 427/255.28 |

FOREIGN PATENT DOCUMENTS

| | | |
|---|---|---|
| JP | 2008-124424 A | 5/2008 |
| JP | 2008-251946 A | 10/2008 |
| JP | 2009-224775 A | 10/2009 |

* cited by examiner (Example 1)

(Example 2)

(Comparative Example 1)

FILM-FORMING APPARATUS

CROSS REFERENCE TO RELATED APPLICATIONS

This application is a national phase of PCT application No. PCT/JP2013/001831, filed on 18 Mar. 2013, which claims priority from Japanese patent application No. 2012-081729, filed on 30 Mar. 2012, all of which are incorporated herein by reference.

TECHNICAL FIELD

The present disclosure relates to a film-forming apparatus that forms a film by sequentially supplying a plurality of kinds of reaction gases which react with each other to a substrate.

BACKGROUND

As a method for forming a film on a substrate, for example, a semiconductor wafer (hereinafter, referred to as a "wafer"), a so-called atomic layer deposition (ALD) method or multi-layer deposition (MLD) method is known in which a plurality of kinds of gases reacting with each other are sequentially supplied to the wafer.

Various gas supply mechanisms that supply the reaction gases to the wafer are proposed in such a film-forming method. For example, Patent Document 1 discloses a film-forming apparatus in which a cylindrical intermediate dispersion body is disposed in a central portion of a dispersion guide having an inclined structure which is widened from the center toward the outer circumference, and gases are introduced into the dispersion guide through a plurality of openings formed in a side surface and a bottom surface of the intermediate dispersion body.

Patent Document 2 discloses a vapor deposition apparatus in which two horns are disposed in a nested form in which the horns have inclined structures which are widened from the center toward the outer circumference with different inclinations, and gases are introduced downward from a space surrounded by the inner horn and a space surrounded by the inner horn and the outer horn, respectively.

In some cases, it has been requested that a film deposited in a nanometer order have uniformity in a wafer plane (e.g., an M-m value to be described later) within about 5%. However, it is difficult to realize in-plane uniformity with such a high precision in a method in which reaction gases are supplied from the central portions of the dispersion guide and the horns in a concentrated manner as disclosed in Patent Documents 1 and 2.

PRIOR ART DOCUMENT

Patent Document

Patent Document 1: Japanese Laid-Open Patent Publication No. 2005-113268, Paragraph 0071, FIGS. 1A and 1B
Patent Document 2: Japanese Laid-Open Patent Publication No. H 7-22323, Paragraphs 0003 and 0018, FIGS. 1 and 8

SUMMARY OF INVENTION

Problems to be Solved

The present disclosure has been made in consideration of such a situation and is to provide a film-forming apparatus which is high in dispersibility of reaction gases and is capable of forming a film with excellent in-plane uniformity.

Means to Solve the Problems

A film-forming apparatus according to the present disclosure forms a film by sequentially supplying a plurality of kinds of reaction gases which react with each other to a substrate within a processing chamber having a vacuum atmosphere and supplying a replacement gas between supply of one reaction gas and supply of next reaction gas. The film-forming apparatus includes: a placing unit provided in the processing chamber to place the substrate thereon; a ceiling section provided to face the placing unit and including an inclined structure which is widened from a center toward an outer circumference; an exhaust unit configured to perform vacuum exhaust of an inside of the processing chamber; a central gas ejecting unit disposed above a central portion of the substrate placed on the placing unit, the central gas ejecting unit including one or more gas ejecting ports formed to spread the gases in a horizontal direction toward an outer side; and a peripheral gas supply unit disposed at a position above an area between a central portion and an outer circumference of the substrate to surround the central gas ejecting unit. The peripheral gas supply unit includes a plurality of gas ejecting ports formed along a circumferential direction so that each of the plurality of gas ejecting ports spreads the gases in a horizontal direction toward the outer circumferential side or the central side of the substrate when viewed in a plan view.

The above-described film-forming apparatus may include the following features.
(a) The plurality of gas ejecting ports of the central gas ejecting unit is formed along the circumferential direction to eject the gases in the horizontal direction toward an outer side. Each of the plurality of gas ejecting ports of the peripheral gas supply unit is formed to eject the gases in the horizontal direction toward the outer circumferential side of the substrate or the central side in the horizontal direction.
(b) The peripheral gas supply unit includes an annular member formed in an annular shape to surround the central gas ejecting unit, and the plurality of gas ejecting ports are formed at each of an inner circumferential surface side and an outer circumferential side to be spaced apart from each other along the circumferential direction.
(c) In item (b), the annular member includes a plurality of gas dispersion units which are formed in a hollow shape and provided within the annular member to be spaced apart from each other in the circumferential direction. Each of the plurality of gas dispersion units includes a plurality of gas ejecting ports which are formed to be spaced apart from each other along the circumferential direction of the gas dispersion unit, the plurality of gas ejecting ports being configured to cause the gases to flow out into the annular member.
(d) The peripheral gas supply unit includes a plurality of gas dispersion units arranged to surround the central gas ejecting unit and to be spaced apart from each other, and a plurality of gas ejecting ports is formed to be spaced apart from each other along the circumferential direction of each of the plurality of gas dispersion units.
(e) The central gas ejecting unit or the gas dispersion unit includes a head unit which protrudes from the ceiling section into the processing chamber and includes a plurality of gas ejecting ports formed to be spaced apart from each other along the circumferential direction, and a swirling flow forming unit configured to form swirling flows of the gases which swirl along a direction where the plurality of gas ejecting ports is arranged within the head unit.

According to the present disclosure, from the central gas ejecting section disposed above the central portion of a substrate, gases are ejected to be spread in the horizontal direction toward an outer side, and further, from the peripheral gas supply section disposed to surround the central gas ejecting section at a position above an area between the central portion and the peripheral edge of the substrate, gases are ejected to be spread in the horizontal direction toward the outer peripheral side and the central side of the substrate when viewed in a plan view. As a result, the reaction gases are uniformly supplied within the space below the ceiling section, and thus, a film with high in-plane uniformity can be formed on the substrate.

DETAILED DESCRIPTION TO EXECUTE THE INVENTION

A configuration of a film-forming apparatus according to an exemplary embodiment of the present disclosure will be described with reference to FIGS. 1 to 4 and FIG. 10. The film-forming apparatus is configured to alternately supply titanium chloride (TiCl4) gas (a raw material gas) and ammonia (NH3) gas (a nitriding gas), which react with each other, to a surface of a wafer W, which is a circular substrate to be formed with a film and has a diameter of, for example, 300 mm, so as to form a titanium nitride (TiN) film by the ALD (MLD) method.

Figure 1:
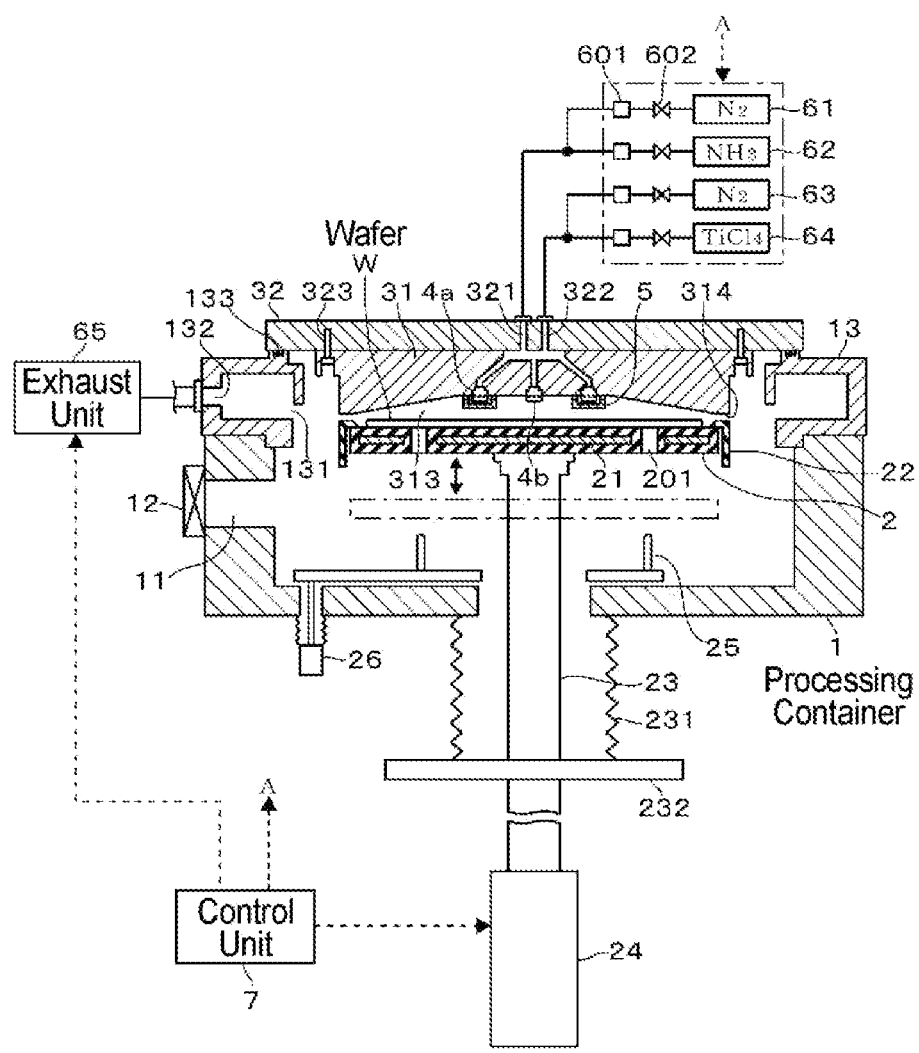
FIG. 1 is a vertical cross-sectional view illustrating a film-forming apparatus according to the present disclosure.
Figure 2:
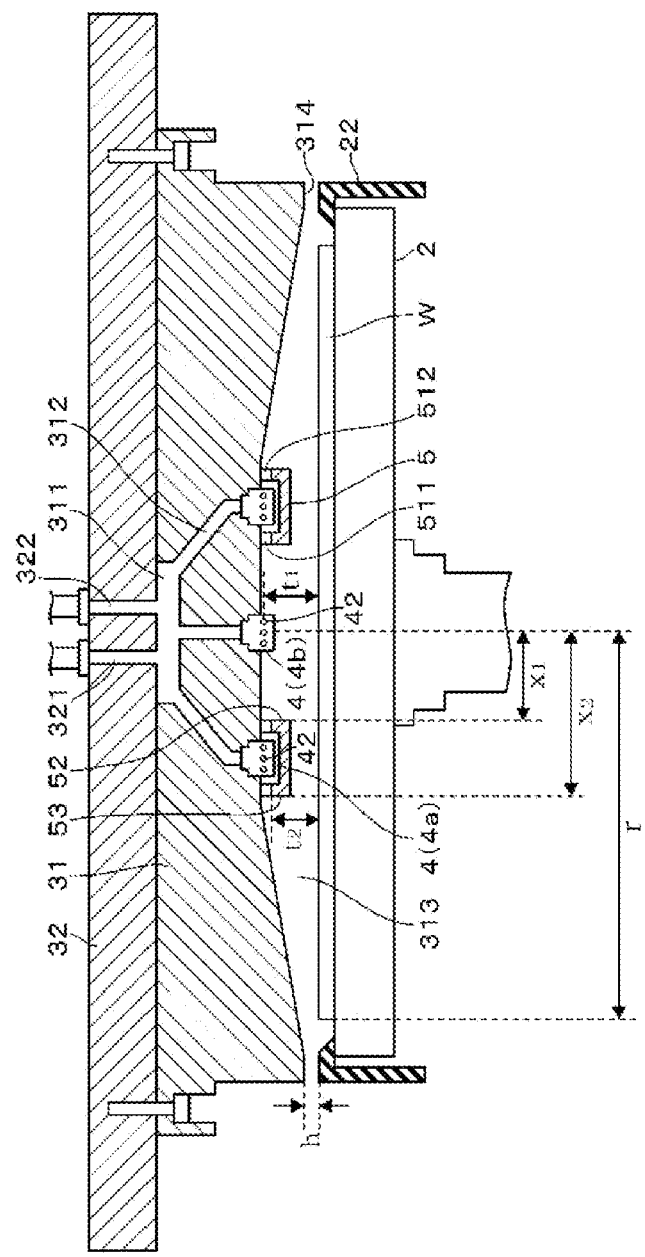
FIG. 2 is a vertical cross-sectional view illustrating a portion of the film-forming apparatus in an enlarged scale.

As illustrated in FIGS. 1 and 2, the film-forming apparatus includes: a processing container 1 which is a vacuum container made of a metal such as, for example, aluminum and having a substantially circular shape in a plan view, and defines a processing chamber; a placing table (placing unit) 2 installed within the processing container 1 so as to place a wafer W thereon; and a ceiling plate 31 provided to face the placing table 2 so as to form a processing space 313 with the ceiling plate 31. A carry-in/out port 11 and a gate valve 12 are provided on a side surface of the processing container 1 in which the carry-in/out port 11 is provided so as to introduce a wafer conveyance mechanism provided on an external vacuum conveyance path into the inside of the processing container 1 when the wafer W is delivered between the wafer conveyance mechanism and the placing table 2 and the gate valve 12 opens/closes the carry-in/out port 11.

An exhaust duct 13 is installed above the carry-in/out port 11 to be stacked on a side wall that forms a body of the processing container 1. The exhaust duct 13 is formed by bending a duct made of a metal such as, for example, aluminum, and has an angular shape in a vertical cross-section, in an annular shape. A slit-like opening 131 extending along a circumferential direction is formed on an inner peripheral surface of the exhaust duct 13, and a gas which has flown out from the processing space 313 is exhausted to the inside of the exhaust duct 13 through the opening 131. An exhaust port 132 is formed on an outer wall of the exhaust duct 13, and an exhaust unit 65 including, for example, a vacuum pump, is connected to the exhaust port 132. The exhaust port 132 and the exhaust unit 65 correspond to an exhaust unit that performs vacuum exhaust of the inside of the processing space 313.

Within the processing container 1, the placing table 2 is mounted at a position inside the exhaust duct 13. The placing table 2 is formed as a circular plate which is slightly larger than the wafer W, and made of, for example, a ceramic such as, for example, aluminum nitride (AlN) or quartz glass (SiO2), or a metal such as, for example, aluminum (Al) or Harstelloy (registered trademark). A heater 21 configured to heat the wafer W to a film-forming temperature in a range of, for example, 350° C. to 450° C., is embedded in the placing table 2. In addition, an electrostatic chuck (not illustrated) may be provided as needed so as to fix the wafer W within a placement region of the top surface side of the placing table 2. Illustration of the heater 21 is omitted in a vertical cross-sectional view other than FIG. 1.

The placing table 2 is provided with a cover member 22 which is configured to cover an outer circumferential side region of the placement region and a side circumferential surface of the placing table 2 all over the circumferential direction thereof. The cover member 22 is made of, for example, alumina, and formed in a substantially cylindrical shape having opened top and bottom end portions in which the top end portion is bent in the horizontal direction toward the inner side all over the circumferential direction thereof. The bent portion is fixedly engaged with a peripheral edge of the placing table 2. The thickness size of the bent portion is larger than the thickness size of the wafer W (0.8 mm) and is set to, for example, 3 mm which is within a range of 1 mm to 5 mm.

A support member 23 is connected to the bottom side central portion of the placing table 2 in which the support member 23 extends vertically through the bottom surface of the placing table 2. The lower end portion of the support member 23 is connected to a lifting mechanism 24 through a flat support plate 232 which is horizontally arranged below the processing container 1. The lifting mechanism 24 moves up and down the placing table 2 between a delivery position (indicated by a one-dot chain line in FIG. 1) where the wafer W introduced from the carry-in/out port 11 is delivered between the placing table 2 and the wafer conveyance mechanism and a processing position above the delivery position where a film-forming is performed on the wafer W.

Between the bottom surface of the placing table 2 which is penetrated by the support member 23 and the support plate 232, a bellows 231 is provided to cover the support member 23 from the outside of the support member 23 in the circumferential direction, in which the bellows 231 separates an atmosphere inside the processing container 1 from the outside and is extended/contracted depending on an ascending/descending operation of the support plate 232.

At the bottom side of the placing table 2, for example, three (3) support pins 25 are provided to support and move up the wafer W from the bottom surface side of the wafer W when the wafer W is delivered between the external wafer conveyance mechanism and the placing table 2. The support pins 25 are connected to the lifting mechanism 26 to be movable up and down, and the delivery of the wafer W between the placing table 2 and the wafer conveyance mechanism is performed by extending/retracting the support pins 25 from the top surface of the placing table 2 through the through holes 201 that penetrate the table 2 in a vertical direction.

A disc-shaped support plate 32 is provide at the top side of the exhaust duct 13 to close the circular opening, and an O-ring 133 is installed between the exhaust duct 13 and the support plate 32 so as to hermetically seal the inside of the processing container 1. The ceiling plate 31 made of a metal is provided at the bottom side of the support plate 32 so as to supply reaction gases and a replacement gas to the processing space 313 to be described below, in which the ceiling plate 31 is fixedly supported on the support plate 32 by bolts 323.

A recess is formed on the bottom surface of the ceiling plate 31 and the central side region of the recess is flattened. An inclined surface is formed at the outer circumferential side of the flattened region in which the inclined surface is gradually widened from the central side to the outer circumferential side. A flat rim 314 is provided at an outer side of the inclined surface.

When the placing table 2 is moved up to the processing position, the ceiling plate 31 is placed such that the top surface of the cover member 22 mounted on the placing table 2 and the bottom surface of the rim 314 face each other with a gap being interposed therebetween. A space enclosed by the recess of the ceiling plate 31 and the top surface of the placing table 2 forms a processing space 313 in which a film-forming is performed on the wafer W. The ceiling plate 31 provided with the recess forms a ceiling section of the film-forming apparatus.

As illustrated in FIG. 2, the height position of the processing position is set such that a gap having a height h is formed between the bottom surface of the rim 314 of the ceiling plate 31 and the top surface of the bent portion of the cover member 22. The opening 131 of the exhaust duct 13 is opened toward the gap. The height h of the gap between the rim 314 and the cover member 22 is set to, for example, 0.5 mm which is within a range of 0.2 mm to 10.0 mm.

When the ceiling plate 31 is viewed in a plan view from the bottom side, a central gas ejecting unit 4b is provided in the central portion of the recess to eject gases into the processing space 313, and, for example, eight (8) gas dispersion units 4a are arranged annularly around the central gas ejecting unit 4b to be spaced apart from each other. In the film-forming apparatus, the central gas ejecting unit 4b and the gas dispersion units 4a are configured by a gas dispersion device 4 having a structure common thereto.

Figure 4A:
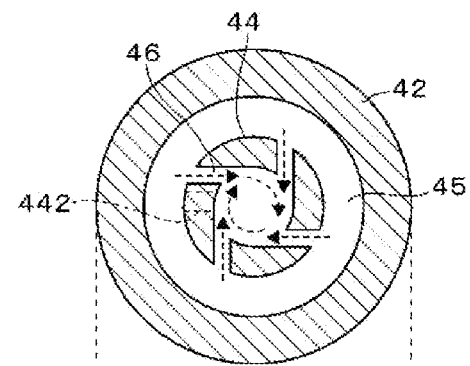
FIGS. 4A to 4C are cross-sectional views illustrating a gas dispersion device provided in the ceiling plate.

Hereinafter, the structure of the gas dispersion device 4 will be described with reference to cross-sectional views of FIGS. 4A to 4C. Here, although FIGS. 4A to 4C illustrates cross-sectional views of a gas dispersion unit 4a covered by the peripheral gas supply unit 5, the central gas ejecting unit 4b of the present example has a configuration common to the gas dispersion unit 4a except that the central gas ejecting unit 4b is not covered by the peripheral gas supply unit 5.

Figure 4B:
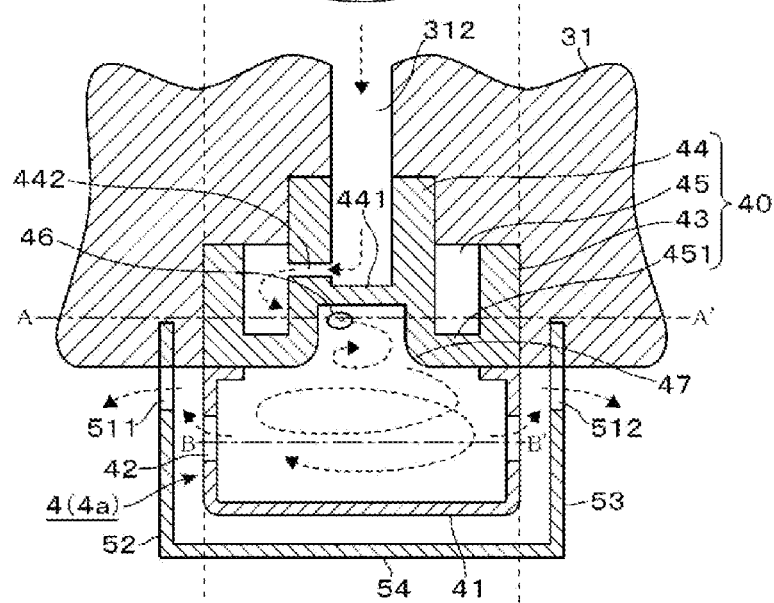
Figure 4C:
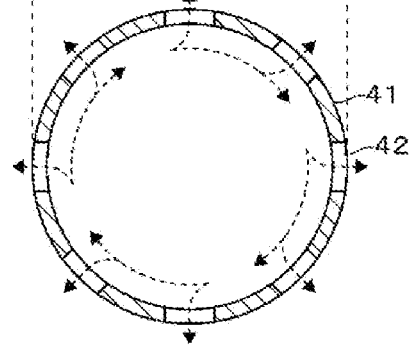

As illustrated in FIG. 4B, the gas dispersion device 4 includes a cylindrical head unit 41 of which the inside is hollow, and a swirling flow forming unit 40 which is provided on the head unit 41 to block an opening formed at the top side of the head unit 41 and introduce gases into the head unit 41 as swirling flows.

The cylindrical head unit 41 is a flat cylindrical metallic member, and is installed within the recess to protrude downwardly from the bottom surface of the ceiling plate 31. On the side surface of the cylindrical head unit 41, a plurality of gas ejecting ports 42 is formed to be spaced apart from each other in the circumferential direction. For example, three (3) gas ejecting ports 42 may be formed, and in the present example, eight (8) gas ejecting ports 42 are formed. While the bottom surface of the head unit 41 is closed so that no gas ejecting port 42 is formed therein, the top side of the head unit 41 is opened and connected to the swirling flow forming unit 40.

The swirling flow forming unit 40 is a dual cylindrical metallic member including an outer tubular portion 43, and an inner tubular portion 44 which has a diameter smaller than that of the outer tubular portion 43 is disposed within the outer tubular portion 43. The bottom end of the outer tubular portion 43 and the bottom end of the inner tubular portion 44 are connected with each other by a connection portion 451. In addition, the top end of the inner tubular portion 44 extends upward to protrude above the top end of the outer tubular portion 43. Meanwhile, at the ceiling plate 31 side, insertion holes are formed to follow the external shapes of the top end portion of the inner tubular portion 44 and the outer tubular portion 43.

In addition, when the outer tubular portion 43 and the inner tubular portion 44 are inserted into the insertion holes of the ceiling plate 31, each gas dispersion device 4 is placed at a predetermined position. For example, male and female screw holes (not illustrated) are formed on the outer peripheral surface of the outer tubular portion 43 and the inner peripheral surface of the insertion hole, respectively, and thus, the outer tubular portion 43 inserted into the insertion hole is fixedly supported on the ceiling plate 31.

The top side of the inner tubular portion 44 is opened toward a gas supply path 312 formed within the ceiling plate 31, and the gases are introduced into the inner tubular portion 44 through the opening. Meanwhile, since a partition plate 441 is provided at an upper height position of about ⅓ of the inner tubular portion 44 in the longitudinal direction from the lower end of the inner tubular portion 44, the gas which has flown into the inner tubular portion 44 does not directly flow out to the head unit 41.

The wall portion of the inner tubular portion 44 at the upper side of the partition plate 441 is provided with an upper side introduction path 442 which is configured to introduce gases into the annular space 45 formed between the inner tubular portion 44 and the outer tubular portion 43. The annular space 45 is a space enclosed by the outer peripheral surface of the inner tubular portion 44, the inner peripheral surface of the outer tubular portion 43, and the wall of the insertion hole (ceiling plate 31), in which the gases are introduced into the annular space 45 from the gas supply path 312 through the upper side introduction path 442.

The wall portion of the inner tubular portion 44 at the lower side of the partition plate 441 is formed with a lower side introduction path 46 which is configured to introduce the gases within the annular space 45 into the lower side of the partition plate 441. As illustrated in the cross-section of FIG. 4A at the position A-A' where the lower side introduction path 46 is formed, for example, four (4) lower side introduction paths 46 are formed so as to introduce the gases along tangential directions of the inner wall of the inner tubular portion 44. The gases introduced into the inner tubular portion 44 from the lower side introduction paths 46 flow in the space at the lower side of the partition plate 441 along the inner wall of the inner tubular portion 44, and as a result, swirling flows are formed. In the cross-sectional view of FIG. 4A, the position where the upper side introduction path 442 is formed is indicated by a broken line. It is not necessary to provide a plurality of lower side introduction paths 46. For example, the swirling flows may be formed merely by introducing the gases along a tangential direction of the inner wall of the inner tubular portion 44 in, for example, one (1) lower side introduction path 46.

Figure 5:
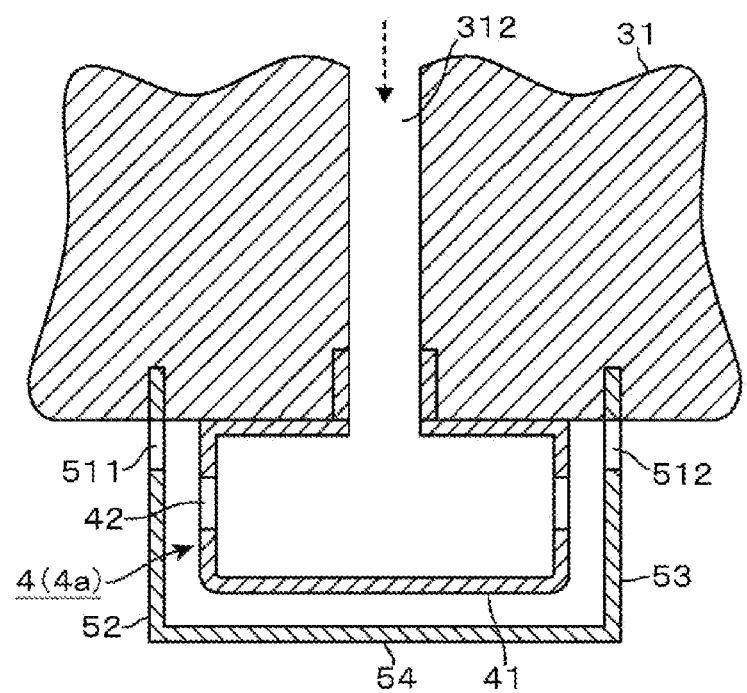
FIG. 5 is a cross-sectional view of another exemplary gas dispersion device.

A guide wall 47 formed in inner tubular portion 44 at the lower side of the partition plate 441 to be gradually widened toward the lower end thereof, and the swirling flows of the gases introduced from the lower side introduction path 46 are guided in the guide wall 47 to be introduced in the head unit 41 while gradually widening the diameter thereof. As a result, the gases which have flown into the head unit 41 swirl in the inside of the side wall of the head unit 41 along a direction in which the gas ejecting ports 42 are arranged as illustrated in FIG. 4C, and are ejected uniformly from each of the gas ejecting ports 42 toward the horizontal direction. In addition, it is not essential to provide the swirling flow forming unit 40 in the gas dispersion device 4, and, for example, as illustrated in FIG. 5, the gases may be directly introduced into the head unit 41 from the opening of the lower end of the gas supply path 312.

Figure 3:
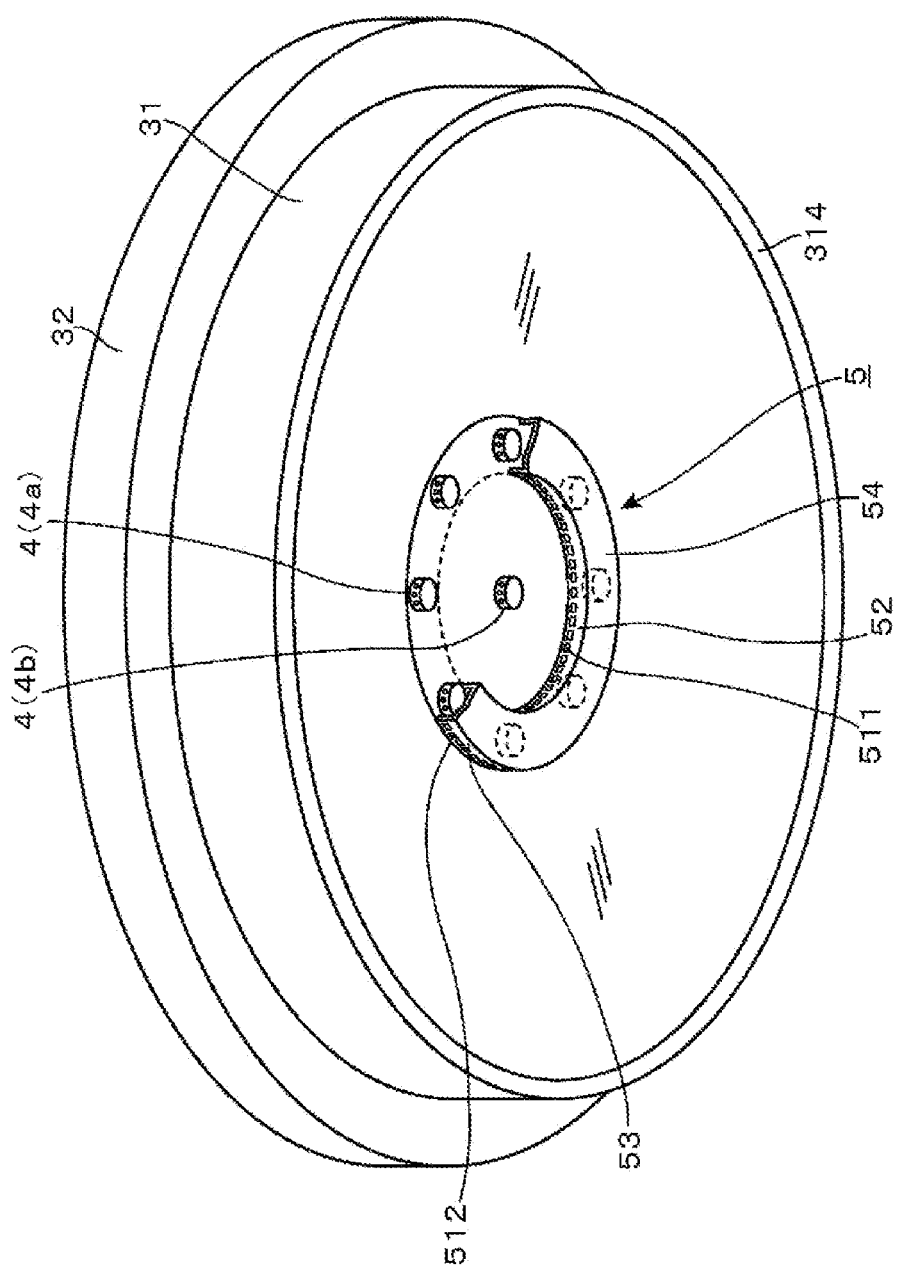
FIG. 3 is a perspective view illustrating a ceiling plate provided in the film-forming apparatus.
Figure 10:
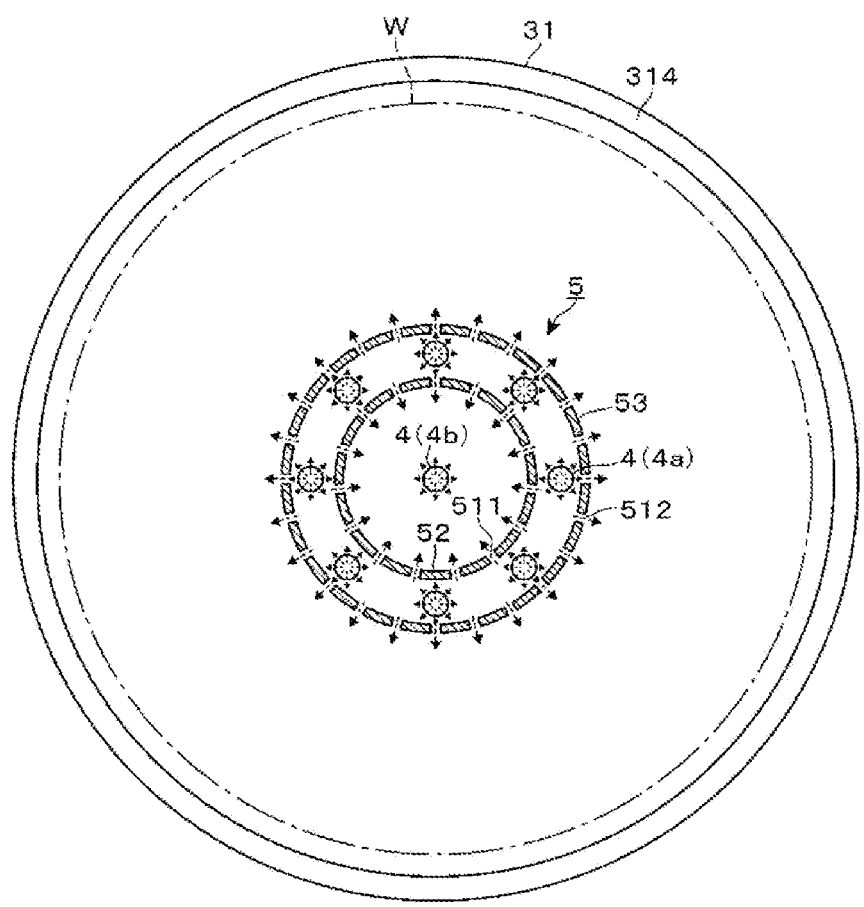
FIG. 10 is an explanatory view illustrating an aspect in which gases are supplied from a gas ejecting unit provided in the ceiling plate.

The gas dispersion device 4 provided with the above-described configuration forms one (1) central gas ejecting unit 4b provided in the central portion and eight (8) gas dispersion units (4a) annularly arranged to surround the central gas ejecting unit 4b and to be spaced apart from each other along the circumferential direction, as illustrated in FIGS. 3 and 10. In addition, the annularly arranged gas dispersion units 4a are covered by a common peripheral gas supply unit 5. Although eight (8) gas dispersion units 4a are provided in the present example, it is sufficient if at least three (3) gas dispersion units 4a are provided.

The peripheral gas supply unit 5 is a flat dual cylindrical member (annular member) including an inner peripheral wall 52 and an outer peripheral wall 53 of the peripheral gas supply unit 5 in which the bottom side of the space interposed between the inner peripheral wall 52 and the outer peripheral wall 53 is closed by a bottom plate 54. Meanwhile, the top side of the space interposed between the inner peripheral wall 52 and the outer peripheral wall 53 is opened, and the top end portions of the inner peripheral wall 52 and the outer peripheral wall 53 are inserted into grooves formed at the bottom side of the ceiling plate 31, respectively. For example, male threads are formed on the inner peripheral surface of the top end portion of the inner peripheral wall 52 or the outer peripheral surface of the top end portion of the outer peripheral wall 53, and female threads are formed in the grooves where the top end portions of the inner peripheral walls 52 and the outer peripheral wall 53 are inserted. As a result, the inner peripheral wall 52 and the outer peripheral wall 53 inserted into the grooves are fixedly supported on the ceiling plate 31.

As illustrated in FIGS. 3 and 10, the inner peripheral wall 52 and the outer peripheral wall 53 are formed such that, in a plan view, the shape of the space interposed between the peripheral walls 52, 53 corresponds to that of the region where the gas dispersion units 4a are annularly arranged. In addition, when the peripheral gas supply unit 5 is attached to the bottom surface of the ceiling plate 31, each of the gas dispersion units 4a is disposed inside the hollow peripheral gas supply unit 5 (within the space enclosed by the inner peripheral wall 52, the outer peripheral wall 53, the bottom plate 54, and the ceiling plate 31) (see, e.g., FIGS. 2 and 4B).

As illustrated in FIGS. 3, 4B and FIG. 10, a plurality of slit-like gas ejecting ports 511, 512 extending horizontally are formed in the inner peripheral wall 52 and the outer peripheral wall 53 at base end side (top side) positions supported on the ceiling plate 31 to be spaced apart from each other along the circumferential direction of each of the peripheral walls 52, 53. The gases which have flown into the peripheral gas supply unit 5 from each of the gas dispersion units 4a are spread within the peripheral gas supply unit 5 and ejected from each of the gas ejecting ports 511, 512 in the horizontal direction, thereby flowing into the processing space 313.

Here, as illustrated in FIG. 2, assuming that the horizontal distance from the center of the central gas ejecting unit 4b to the inner peripheral wall 52 of the peripheral gas supply unit 5 is $x_1$, the horizontal distance from the center of the central gas ejecting unit 4b to the outer peripheral wall 53 is $x_2$ ($x_2 > x_1$), and the radius of the wafer W is r, the peripheral gas supply unit 5 may be configured such that the value of $x_1/r$ is in a range of 0.13 to 0.6 and the value of $x_2/r$ is in a range of 0.26 to 0.73. When the value of $x_1/r$ is smaller than 0.13 or the value of $x_2/r$ is smaller than 0.26, the gas concentration is excessively increased in the central portion of the wafer W and thus, it is not desirable. In addition, when the value of $x_1/r$ is larger than 0.6 or the value of $x_2/r$ is larger than 0.73, the gas concentration is excessively increased in the peripheral portion of the wafer W and thus, it is not desirable. The gases are ejected from the gas ejecting ports 42, 511, 512, which are respectively formed in the central gas ejecting unit 4b, the inner peripheral wall 52 of the peripheral gas supply unit 5, and the outer peripheral wall 53 of the peripheral gas supply unit 5, to the positions which are apart from each other in the radial direction of the wafer W. Thus, the gases are supplied uniformly over a wide range.

In addition, the height t1 from the top surface of the wafer W on the placing table 2 to the gas ejecting port 42 of the central gas ejecting unit 4b and the height t2 from the top surface of the wafer W to the gas ejecting ports 511, 512 of the peripheral gas supply unit 5 may be set to be in a range of 10 mm to 50 mm, preferably in a range of 15 mm to 20 mm. When the height is larger than 50 mm, gas replacement efficiency may be reduced, and when the height is smaller than 10 mm, a space to provide the central gas ejecting unit 4b or the peripheral gas supply unit 5 may be lost, or the gas may hardly flow in the inside of the processing space 313.

As illustrated in FIG. 2, a gas supply path 312 configured to supply the gases to each of the gas dispersion devices 4 (the central gas ejecting unit 4b and the gas dispersion units 4a) are formed in the ceiling plate 31 which is provided with the central gas ejecting unit 4b and the gas dispersion units 4a). The gas supply path 312 is connected to a gas diffusion space 311 formed between the top surface of the ceiling plate 31 and the bottom surface of the support plate 32.

As illustrated in FIG. 1, an ammonia supply path 321 is formed in the support plate 32 to supply ammonia gas and nitrogen gas for replacement to the diffusion space 311, and similarly, a titanium chloride supply path 322 is formed in the support plate 32 to supply titanium chloride gas and nitrogen gas for replacement to the diffusion space 311. The ammonia supply path 321 and the titanium chloride supply path 322 are respectively connected to an ammonia gas supply unit 62 and a titanium chloride gas supply unit 64 through pipes, each of which is branched in its way to be connected to a nitrogen gas supply unit 61 or 63. Each pipe is provided with an opening/closing valve 602 configured to perform feeding/shut-off of a gas, and a flow regulating unit 601 configured to regulate a gas supply amount. For the convenience of illustration, FIG. 1 illustrates the nitrogen gas supply units 61, 63 separately from each other. However, a common nitrogen supply source may be used.

The film-forming apparatus configured as described above is connected with a control unit 7 as illustrated in FIG. 1. The control unit 7 includes a computer which is provided with, for example, a CPU and a storage unit (not illustrated). The storage unit stores a program in which a group of steps (commands) related to a control of operations of the film-forming apparatus are set up in which the operations of the film forming apparatus include moving up a wafer W placed on the placing table 2 to a processing position, forming a TiN film by supplying reaction gases and a replacement gas into the processing space 313 in a predetermined sequence, and carrying the wafer W formed with the film out of the processing space 313. The program is stored in a storage medium such as, for example, a hard disc, a compact disc, a magnet optical disc, or a memory card, and installed in the computer therefrom.

Next, the actions of the film-forming apparatus will be described with reference to FIGS. 6 to 10. First, the inside of the processing container 1 is decompressed to a vacuum atmosphere in advance, and then the placing table 2 is moved down to the delivery position. Then, the gate valve 12 is opened to introduce the conveyance arm of the wafer conveyance mechanism, and the wafer W is delivered between the support pins 25 and the conveyance arm. Thereafter, the support pins 25 are moved down, and the wafer W is placed on the placing table 2 heated to the above-described film-forming temperature by the heater 21.

Figure 6:
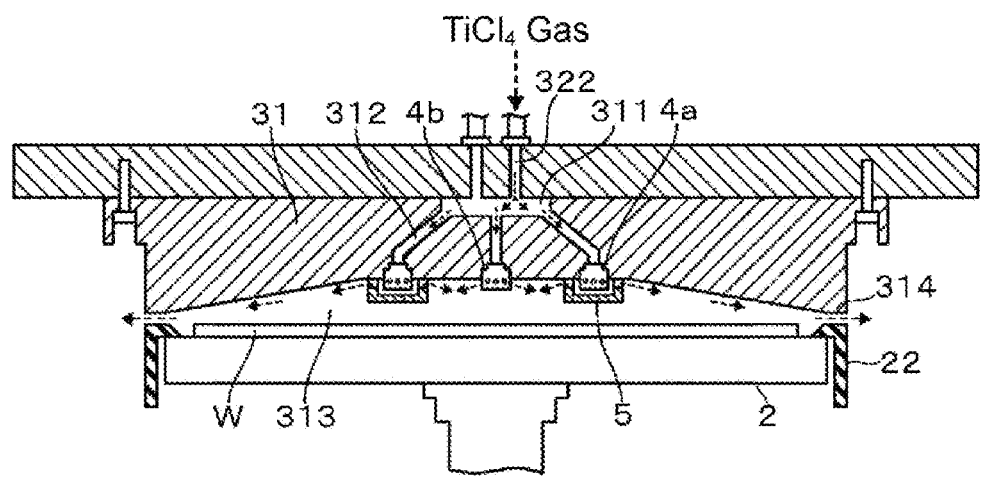
FIG. 6 is a first explanatory view illustrating an action of the film-forming apparatus.

Next, the gate valve 12 is closed, the placing table 2 is moved up to the processing position, the pressure within the processing container 1 is regulated, and then, titanium chloride gas is supplied from the titanium chloride gas supply unit 64 (FIG. 6). The supplied titanium chloride gas flows into each of the gas dispersion units 4a and the central gas ejecting units 4b through the titanium chloride supply path 322, the diffusion space 311, and the gas supply path 312.

The titanium chloride gas which has flown into the central gas ejecting unit 4b is supplied to the processing space 313 through the gas ejecting port 42. Meanwhile, the titanium chloride gas which has been flown into each of the gas dispersion units 4a flows into the peripheral gas supply unit 5 through the head unit 41, and further, is supplied to the inside of the processing space 313 through the gas ejecting ports 511, 512 formed in the peripheral gas supply unit 5.

The titanium chloride gas which has been radially supplied to the processing space 313 is spread out in the radial direction from the processing space 313 from the central side of the ceiling plate 31 toward the outer peripheral side.

In addition, the titanium chloride gas flowing within the processing space 313 is also spread downward, and upon coming in contact with the surface of the wafer W on the placing table 2, the titanium chloride gas is adsorbed onto the wafer W. In addition, the titanium chloride gas which has flown within the processing space 313 and has reached the gap between the rim 314 and the cover member processing space 313 flows out into the processing container 1 from the space and then is discharged to the outside through the exhaust duct 13.

Figure 7:
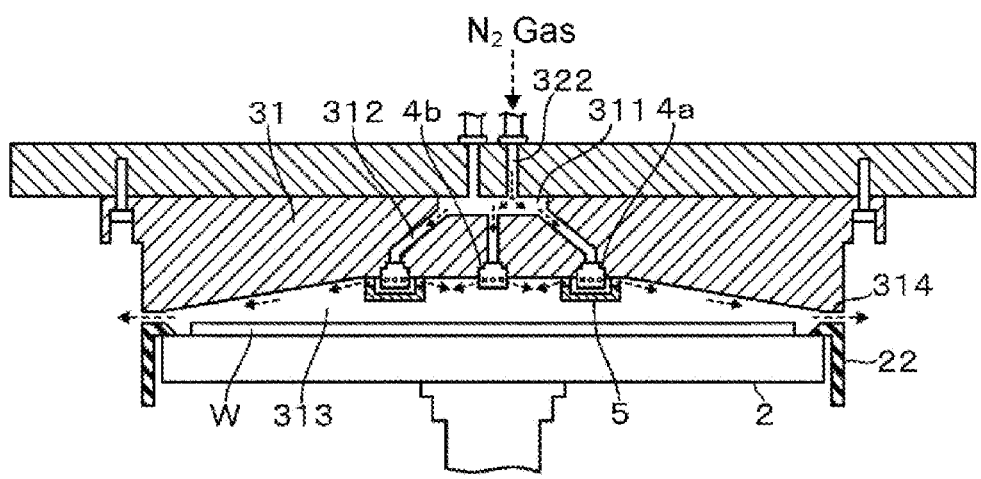
FIG. 7 is a second explanatory view illustrating an action of the film-forming apparatus.

Next, the supply of the titanium chloride gas is stopped, and nitrogen gas as the replacement gas is supplied from the nitrogen gas supply unit 63 (FIG. 7). The nitrogen gas is supplied to the inside of the processing space 313 through the same path as the titanium chloride gas, and the titanium chloride gas within the path and the processing space 313 is replaced by the nitrogen gas.

Figure 8:
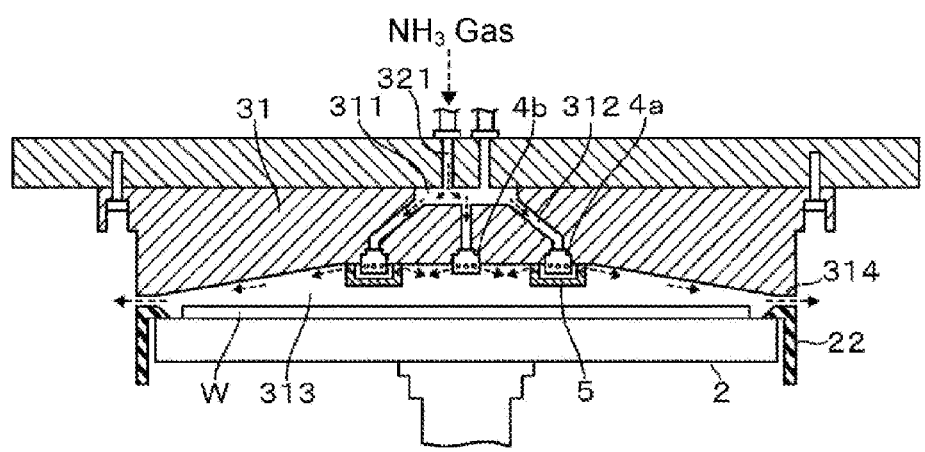
FIG. 8 is a third explanatory view illustrating an action of the film-forming apparatus.

Thereafter, the supply of the nitrogen gas is stopped, and ammonia gas is supplied from the ammonia gas supply unit 62 (FIG. 8). The supplied ammonia gas flows into each of the gas dispersion units 4a and the central gas ejecting unit 4b through the ammonia supply path 321, the diffusion space 311, and the gas supply path 312. Then, the ammonia gas is supplied to the inside of the processing space 313 directly from central gas ejecting unit 4b and through the peripheral gas supply unit 5 from the gas dispersion units 4a, which is the same as the titanium chloride gas.

Figure 9:
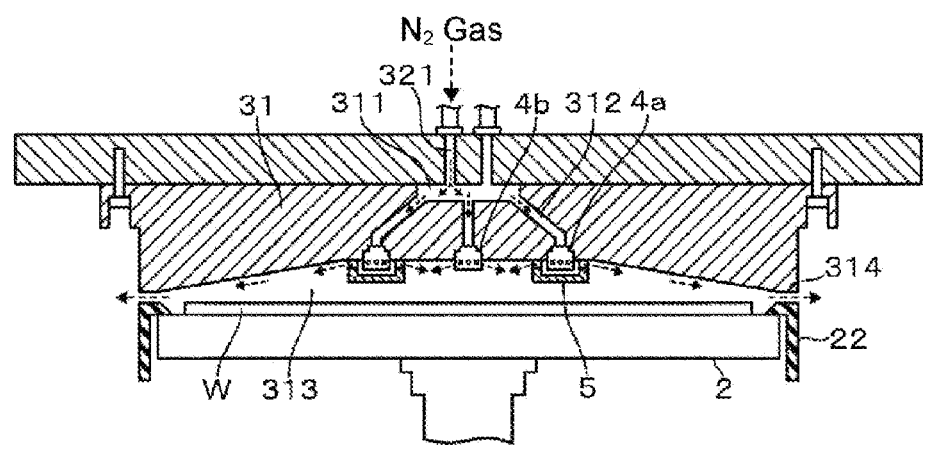
FIG. 9 is a fourth explanatory view illustrating an action of the film-forming apparatus.

When the ammonia gas flowing within the processing space 313 reaches the surface of the wafer W, the component of the titanium chloride gas previously adsorbed to the wafer is nitrided, forming titanium nitride. Thereafter, the gas supplied to the gas supply path 312 is switched to nitrogen gas for replacement from the nitrogen gas supply unit 61 so that the ammonia gas within the ammonia gas supply path and the processing space 313 is replaced by the nitrogen gas (FIG. 9).

In this manner, the reaction gases (titanium chloride gas and ammonia gas) and the replacement gas (nitrogen gas) are repeatedly supplied in the order of titanium chloride gas, nitrogen gas, ammonia gas, and nitrogen gas so that a molecular layer of the titanium nitride (TiN) is laminated and a titanium nitride film is formed on the surface of the wafer W.

Next, the operations of the central gas ejecting unit 4b, the gas dispersion unit 4a, and the peripheral gas supply unit 5 when the reaction gases and the replacement gas are supplied will be described with reference to FIG. 10. First, the gas supplied from the gas supply path 312 to the central gas ejecting unit 4b is uniformly ejected into the processing space 313 from the plurality of gas ejecting ports 42, which is formed to be spaced apart from each other along the circumferential direction of the head unit 41, in the horizontal direction toward the outer side.

Meanwhile, the gas supplied to each of the gas dispersion units 4a from the gas supply path 312 uniformly flows out into the peripheral gas supply unit 5 in the horizontal direction toward the outer side from the gas ejecting ports 42 formed to be spaced apart from each other in the circumferential direction of the head unit 41 as in the case where the gas is supplied to the central gas ejecting unit 4b.

The gas which has flown out into the peripheral gas supply unit 5 is spread within the space of the peripheral gas supply unit 5. In addition, from the gas ejecting ports 511 formed to be spaced apart from each other along the circumferential direction of the inner peripheral wall 52 (inner peripheral surface), the gas is uniformly ejected in the horizontal direction toward the direction where the central gas ejecting unit 4b is disposed. Further, from the gas ejecting ports 512 formed to be spaced apart from each other along the circumferential direction of the outer peripheral wall 53 (outer peripheral surface), the gas is uniformly ejected in the horizontal direction toward the outer circumferential side of the wafer W.

In FIG. 10, when the ceiling plate 31 is viewed from the bottom side, the gases ejected from the central gas ejecting unit 4b, the gas dispersion units 4a, and the peripheral gas supply unit 5 are indicated by arrows and the circumferential edge of the wafer W disposed below the ceiling plate 31 is indicated by a one-dot chain line. Descriptions will be made based on a positional relationship in relation to the wafer W. The central gas ejecting unit 4b is disposed above the central portion of the wafer W on the placing table 2 and ejects gases from this position in the horizontal direction toward the outer side. The peripheral gas supply unit 5 is positioned above an area between the central portion and the outer circumference of the wafer W, the gas ejecting ports 511 at the inner peripheral surface (inner peripheral wall 52) side eject gases in the horizontal direction toward the central side of the wafer W, and the gas ejecting ports 512 at the outer peripheral surface (outer peripheral wall 53) side eject gases in the horizontal direction toward the outer circumferential side of the wafer W.

In this manner, in the processing space 313, the gases are dispersed and uniformly supplied from the central gas ejecting unit 4b and the peripheral gas supply unit 5 around the central gas ejecting unit 4b which are provided at the positions which are separated from each other in the radial direction of the wafer W. In addition, because the gases are dispersed from the plurality of gas ejecting ports 42, 511, 512 and supplied in the horizontal direction, the flow rates of the reaction gases (titanium chloride gas and ammonia gas) ejected from each of the gas ejecting ports 42, 511, 512 are reduced. As a result, the flow rates of the reaction gases are reduced when they reach the surface of the wafer W and the in-plane uniformity of a film is improved.

Meanwhile, since the replacement gas (nitrogen gas) is supplied in a sufficient flow rate with respect to the internal volume of the processing space 313 so that the gases are supplied in a previously dispersed state over a wide region, the reaction gases within the processing space 313 may be quickly removed and replaced by the replacement gas.

When a titanium nitride film with a desired film thickness has been formed by repeating the supply of the titanium chloride gas and the supply of the ammonia gas, for example, dozens of times to hundreds of times, the nitrogen gas for replacement is supplied so as to finally discharge the ammonia gas, and then the placing table 2 is moved down to the delivery position. Then, the gate valve 12 is opened and the conveyance arm is introduced therethrough. In a sequence opposite to that at the time of carry-in of the wafer W, the wafer W is delivered from the support pins 25 to the conveyance arm and carrying-out of the wafer W formed with the film is performed. Then, carry-in of the next wafer W is awaited.

According to the film-forming apparatus of the present exemplary embodiment, the following effects may be obtained. From the central gas ejecting unit 4b disposed above the central portion of the wafer W, gases are ejected in the horizontal direction toward the outer side. In addition, from the peripheral gas supply unit 5 disposed at a position above an area between the central portion and the outer circumference of the wafer W to surround the central gas ejecting unit 4b, gases are ejected in the horizontal direction toward the outer circumferential side and the central side of the wafer W when viewed in a plan view, respectively. As a result, because the reaction gases of a low flow rate are supplied to the processing space 313 below the ceiling plate 31, a film with high in-plane uniformity may be formed on the wafer W.

Figure 11:
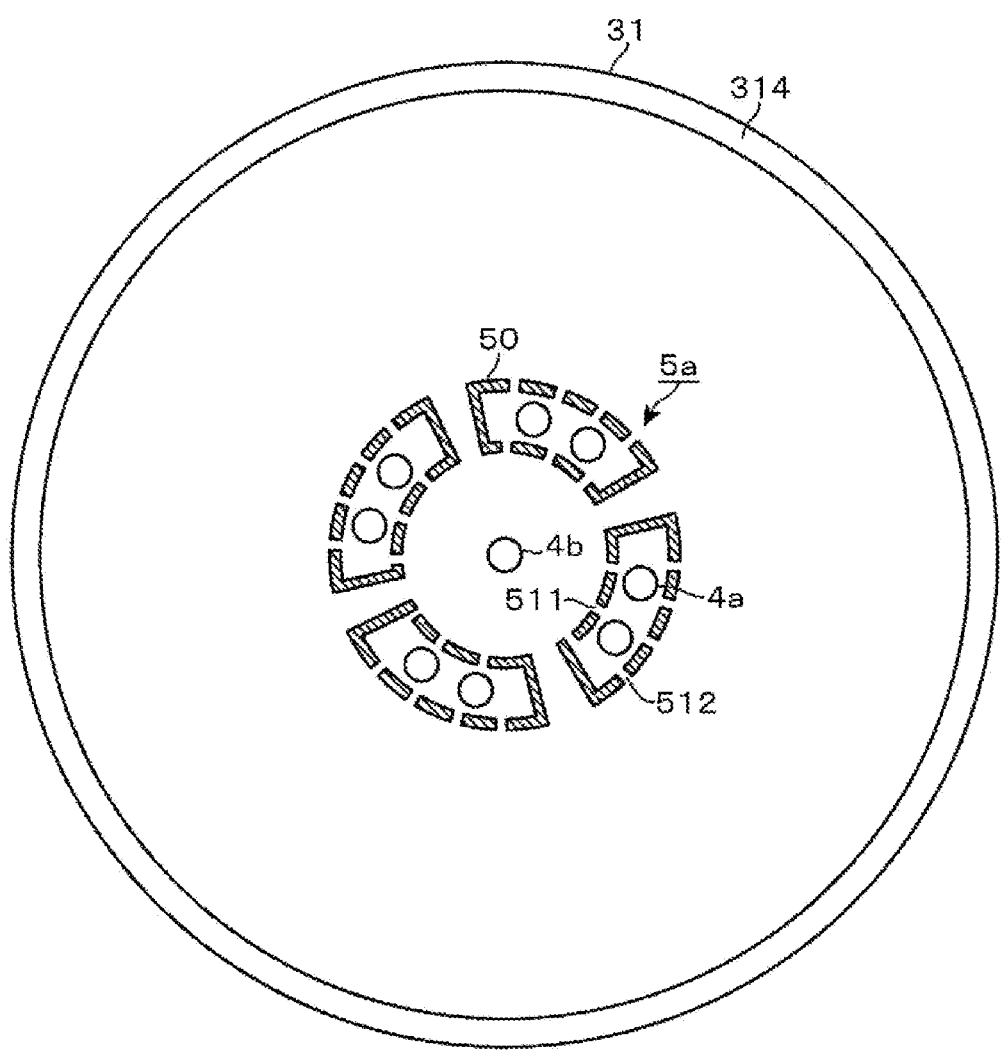
FIG. 11 is a plan view illustrating another exemplary peripheral gas supply unit formed in an annular shape.

As in an example illustrated in FIG. 11, a peripheral gas supply unit 5a may be configured such that segmented units 50, which are segmented in the circumferential direction and have a fan shape in planar shape, are arranged annularly in the circumferential direction. In addition, although FIGS. 10 and 11 illustrate an example in which a peripheral gas supply unit 5 or 5a is provided on the circumference of a single virtual circle, a plurality of peripheral gas supply units 5 or 5a may be arranged concentrically, and a plurality of gas dispersion units 4a may be annularly arranged in each of the peripheral gas supply units 5 or 5a.

In addition, providing a flat dual-cylindrical member (annular member) as the peripheral gas supply unit 5 or 5a is not an essential requirement. As illustrated in the film-forming apparatus of FIG. 12, the gas dispersion units 4a disposed annularly to be spaced apart from each other to surround the central gas ejecting unit 4b in the circumferential direction may be provided to be exposed within the processing space 313. In such a case, the gas dispersion units 4a correspond to the peripheral gas supply unit 5. On the contrary, gases may be supplied toward the inner space of the peripheral gas supply unit 5 directly from the opening at the lower end of the gas supply path 312 without providing the gas dispersion units 4a within the peripheral gas supply unit 5 (FIG. 13).

In addition, the configuration of the ejecting ports 42 formed in the head unit 41 of the gas dispersion device 4 is not limited to those exemplified in FIG. 4. For example, one slit may be formed to extend in the circumferential direction of the side surface of the head unit 41 and a mesh member may be covered on the side surface of the head unit 41 so that each mesh may form an ejecting port. In addition, the central gas ejecting unit 4b may be constituted with a plurality of gas dispersion devices 4, or a plurality of gas dispersion devices 4 may be disposed in a concentrated region above the central portion of the wafer W and within the peripheral gas supply unit 5 to configure the central gas ejecting units 4b.

In addition, providing the gas dispersion device 4 in the head unit 41 is not an essential requirement as well. The gas dispersion device may be configured using only the swirling flow forming unit 40 illustrated in FIGS. 4A and 4B. When the gas dispersion device configured only by the swirling flow forming unit 40 is used as the central gas ejecting unit as described above, the gases ejected from the outlet of the lower side introduction path 46 are spread in the horizontal direction toward the outer side while forming swirling flows. Further, when the gas dispersion device (swirling flow forming unit 40) is used as the gas dispersion unit of the peripheral gas supply unit which is not provided with an annular member, the gases are ejected from each of the plurality of gas dispersion devices arranged to be spaced apart from each other to surround the central gas ejecting unit while forming swirling flows. In addition, the gases of respective swirling flows are spread in the horizontal direction and joined, and the gases are spread toward the outer circumferential side and the central side of the wafer W when viewed in a plan view. In such a case, the openings at the lower end of the swirling flow forming unit 40 become gas ejecting ports.

In addition, the shape of the ceiling plate 31 is not limited to those illustrated in the examples illustrated in FIGS. 1 and 2. For example, without providing the flat region in the central portion of the recess, the periphery gas supply unit 5 may be provided on an inclined surface which is widened from the center toward the peripheral edge of the recess. Of course, a ceiling plate 31 which is not formed with the rim 314 may be used.

In addition, besides the above-described TiN film, the film-forming apparatus of the present invention may form a film containing a metallic element, for example, an element of the period 3 in the periodic table such as Al or Si, an element of the period 4 in the periodic table such as Ti, Cr, Mn, Fe, Co, Ni, Cu, Zn, or Ge, an element of the period 5 in the periodic table such as Zr, Mo, Ru, Rh, Pd, or Ag, or an element of the period 6 in the periodic table such as Ba, Hf, Ta, W, Re, Ir, and Pt. As for a metallic raw material adsorbed onto a surface of a wafer W, for example, organic metallic compounds or inorganic metallic compounds of the above-mentioned metallic elements may be used as reaction gases (raw material gases). Specific examples of metallic raw materials may include BTBAS (bis(tert-butylamino) silane), DCS (dichlorosilane), HCD (hexadichlorosilane), TMA (trimethyl aluminum), and 3DMAS (tris(dimethylamino)silane), besides TiCl4 described above.

In addition, as for a method of reacting raw material gases adsorbed to the surface of the wafer W to obtain a desired film, various reactions, such as, for example, an oxidation reaction using, for example, O2, O3, or H2O, a reduction reaction using, for example, an organic acid such as, for example, H2 or HCOOH, or alcohols such as, for example, CH3COOH, CH3OH, or C2H5OH, a carbonization reaction using, for example, CH4, C2H6, C2H4, or C2H2, and a nitriding reaction using, for example, NH3, NH2NH2, or N2, may be used.

Further, three or four kinds of reactions gases may be used as the reaction gases. An example of using three kinds of reaction gases is forming a strontium titanate (SrTiO3) film in which, for example, Sr(THD)2 (bis(tetramethylheptanedionato)strontium) as a raw material for Sr, Ti(OiPr)2 (THD)2 (bis(isopropoxide)bis(tetramethylheptanedionato) titanium) as a raw material for Ti, and ozone gas as an oxidation gas thereof are used. In this case, the gases are switched in the order of the Sr raw material gas, the replacement gas, the oxidation gas, the replacement gas, the Ti raw material gas, the replacement gas, the oxidation gas, and the replacement gas. In addition, a circular wafer W has been described as a substrate on which a film-forming processing is performed, the present disclosure may also be applied to, for example, a rectangular glass substrate (an LCD substrate).

EXAMPLES

Test

Titanium nitride films were formed by supplying titanium chloride gas and ammonia gas into the processing spaces 313 using film-forming apparatuses provided with different types of ceiling plates 31, and the in-plane uniformity thereof was measured.

A. Test Conditions

Example 1

Titanium nitride films were formed using a ceiling plate 31 which was provided with a central gas ejecting unit 4b, and a peripheral gas supply unit 5 which included gas dispersion units 4a and an annular member as illustrated in FIGS. 2 and 10. The film thicknesses of the formed films were measured using a spectral ellipsometry type film thickness meter and the in-plane uniformity (M-m value) was calculated based on the following Equation (1).

$$(M\text{-}m \text{ value}) = \{(\text{maximum film thickness } (M \text{ value}) - \text{minimum film thickness } (m \text{ value}))/(2 \times \text{average film thickness})\} \times 100(\%) \quad (1)$$

Example 2

Figure 12:
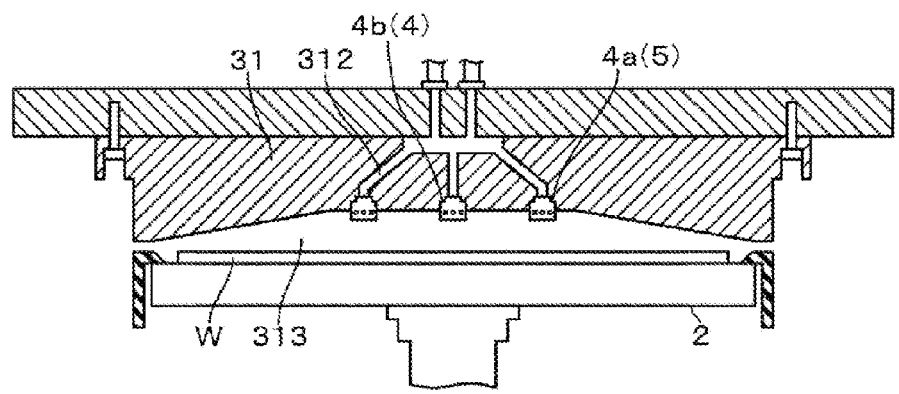
FIG. 12 is a vertical cross-sectional view illustrating another exemplary film-forming apparatus.
Figure 13:
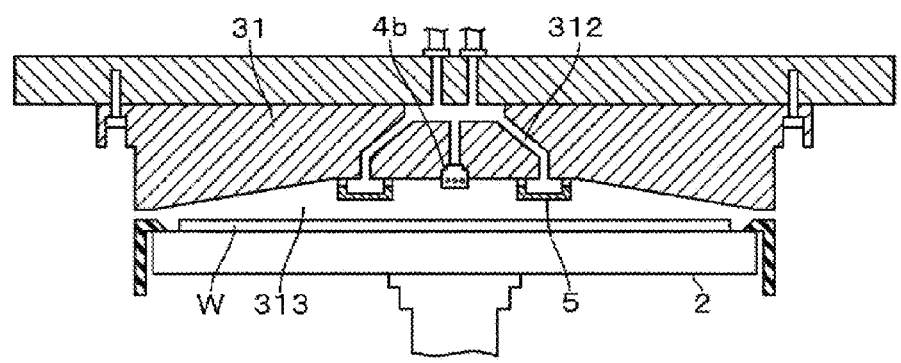
FIG. 13 is a vertical cross-sectional view illustrating still another exemplary film-forming apparatus.

Titanium nitride films were formed using a ceiling plate 31 in which a central gas ejecting unit 4b and a peripheral gas supply unit 5 configured by gas dispersion units 4a were disposed without being provided with an annular member in the peripheral gas supply unit 5 as illustrated in FIG. 12, and the in-plane uniformity was calculated by the same manner as that in Example 1. The arrangement of the gas dispersion units 4a when the ceiling plate 31 is viewed in a plan view is the same as the gas dispersion units 4a illustrated in FIG. 10.

Comparative Example 1

Figure 14:
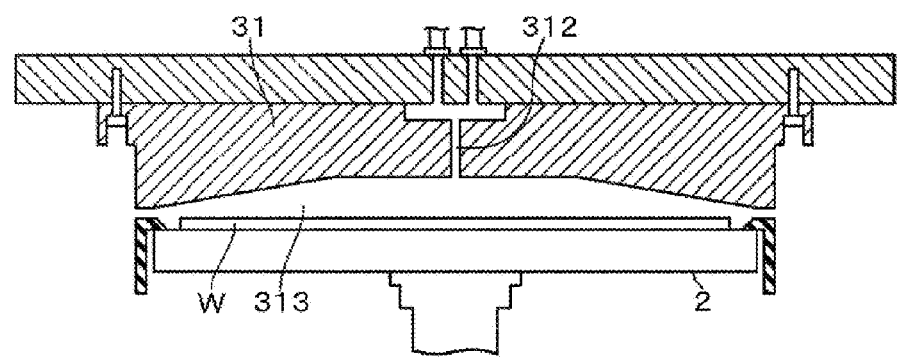
FIG. 14 is a vertical cross-sectional view illustrating a film-forming apparatus according to a comparative example.

Films were formed using a ceiling plate 31 including one gas supply path 312 opened toward the central portion of the bottom side as illustrated in FIG. 14, and the in-plane uniformity was calculated by the same manner as that in Example 1.

B. Test Result

Figure 15A:
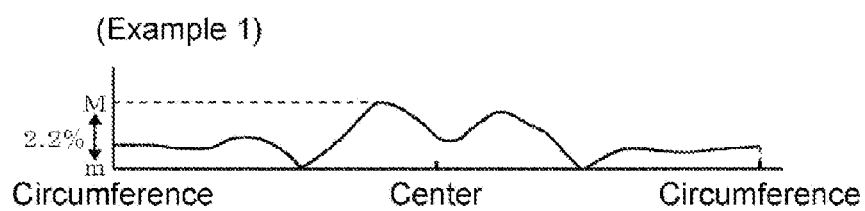
FIGS. 15A to 15C are graphs representing film-forming results according to Examples and Comparative Example.
Figure 15B:
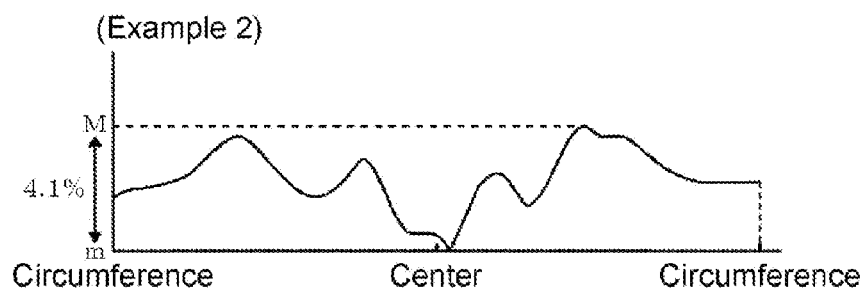
Figure 15C:
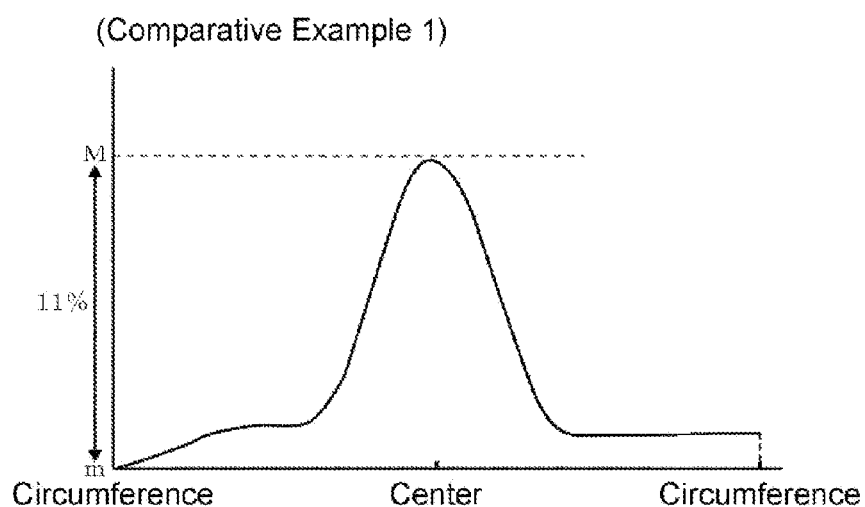

Variations of film thicknesses of the films formed in Examples 1 and 2 and Comparative Example 1 are represented in FIGS. 15A to 15C, respectively. In each figure, the horizontal axis represents a position in the radial direction of each wafer W, and the vertical axis represents a relative variation of a film thickness with respect to an M-m value.

According to the results represented in FIGS. 15A and 15B, in Example 1 in which the gas dispersion units 4a were disposed inside the peripheral gas supply unit 5 formed as the annular member, the M-m value became 2.2% while, in Example 2 in which the gas dispersion units 4a were annularly arranged to form the peripheral gas supply unit 5, the M-m value became 4.1%. As a result, both Examples achieved high in-plane uniformity within 5%. When comparing Example 1 and Example 2, the in-plane uniformity in Example 1 in which the gas dispersion units 4a were arranged inside the peripheral gas supply unit 5 becomes higher.

Meanwhile, in Comparative Example 1 in which the gases were supplied from the opening formed in the central portion of the ceiling plate 31, a mountain-shaped thickness distribution was found in which the film thickness was the thickest at the position below the opening where the gas was supplied, and was sharply reduced toward the outer circumferential side of the wafer W. In addition, the M-m value in Comparative Example 1 became 11% which is more than twice the requested value (5%). It is believed that this result was obtained because the adsorption amounts of the raw material gases varied between a region where reaction gases reached each wafer W at a high speed and a region outside the region.

The invention claimed is:

1. A film-forming apparatus that forms a film by sequentially supplying a plurality of kinds of reaction gases which react with each other to a substrate within a processing chamber having a vacuum atmosphere and supplying a replacement gas between supply of one reaction gas and supply of next reaction gas, the film-forming apparatus comprising:

a placing unit provided in the processing chamber to place the substrate thereon;

a ceiling section provided to face the placing unit;

an exhaust unit configured to perform vacuum exhaust of an inside of the processing chamber;

a central gas ejecting unit disposed above a central portion of the substrate placed on the placing unit, the central gas ejecting unit including one or more gas ejecting ports formed to spread the gases in a horizontal direction toward an outer side; and a peripheral gas supply unit disposed at a position above an area between a central portion and an outer circumference of the substrate to surround the central gas ejecting unit, wherein the peripheral gas supply unit includes an annular member formed in an annular shape to surround the central gas ejecting unit, with a plurality of gas dispersion units formed in a hollow shape and provided within the annular member and spaced apart from each other in a circumferential direction, and with a plurality of gas ejecting ports formed and spaced apart along the circumferential direction at each of an inner circumferential surface side and an outer circumferential side of the annular member so that gases dispersed by the gas dispersion units spread through the gas ejecting ports formed in the outer circumferential surface side of the annular member in a horizontal direction toward the outer circumferential side of the substrate and gases dispersed by the gas dispersion units spread through the gas ejecting ports formed in the inner circumferential surface side of the annual member in a horizontal direction toward the central side of the substrate.

2. The film-forming apparatus of claim 1, wherein each of the plurality of gas dispersion units includes a plurality of gas ejecting ports which are formed to be spaced apart from each other along the circumferential direction of the gas dispersion unit, the plurality of gas ejecting ports being configured to cause the gases to flow out into the annular member.

3. The film-forming apparatus of claim 1, wherein the central gas ejecting unit or the gas dispersion unit includes a head unit which protrudes from the ceiling section into the processing chamber and includes a plurality of gas ejecting ports formed to be spaced apart from each other along the circumferential direction, and a swirling flow forming unit configured to form swirling flows of the gases which swirl along a direction where the plurality of gas ejecting ports is arranged within the head unit.

* * * * *